US010393409B2

(12) United States Patent
Davis (10) Patent No.: US 10,393,409 B2
(45) Date of Patent: Aug. 27, 2019

(54) DEVICE AND METHOD FOR TEMPERATURE CONTROL (71) Applicant: FORCED PHYSICS LLC, Reston, VA (US)

(72) Inventor: Scott Davis, Reston, VA (US)

(73) Assignee: Forced Physics, LLC, Scottsdale, AZ (US)

( * ) Notice: Subject to any disclaimer, the term of this patent is extended or adjusted under 35 U.S.C. 154(b) by 0 days.

(21) Appl. No.: 14/432,685

(22) PCT Filed: Sep. 26, 2013

(86) PCT No.: PCT/US2013/061887
§ 371 (c)(1),
(2) Date: Mar. 31, 2015

(87) PCT Pub. No.: WO2014/055323
PCT Pub. Date: Apr. 10, 2014

(65) Prior Publication Data
US 2015/0253041 A1 Sep. 10, 2015

Related U.S. Application Data (60) Provisional application No. 61/708,619, filed on Oct. 1, 2012.

(51) Int. Cl.
F25B 9/00 (2006.01)
F25B 9/06 (2006.01)
(Continued)

(52) U.S. Cl.
CPC ............. F25B 9/004 (2013.01); F25B 9/065 (2013.01); F28F 13/08 (2013.01); H01L 23/467 (2013.01);
(Continued)

(58) Field of Classification Search
CPC ..... F28F 13/08; F28F 2260/02; H01L 23/467; H01L 2924/0002; F25B 9/004; F25B 9/065
See application file for complete search history.

(56) References Cited

U.S. PATENT DOCUMENTS 7,593,230 B2 9/2009 Abul-Haj et al.
2005/0205241 A1* 9/2005 Goodson ............... F04B 19/006
165/80.4
(Continued)

FOREIGN PATENT DOCUMENTS

CA 1 130 431 8/1982
CN 1906271 A 1/2007
(Continued)

OTHER PUBLICATIONS

International Search Report from the European Patent Office for International Application No. PCT/US2013/061887, dated Jan. 22, 2014.
(Continued)

Primary Examiner — Lore R Jarrett
(74) Attorney, Agent, or Firm — Finnegan, Henderson, Farabow, Garrett & Dunner, LLP (57) ABSTRACT Materials, components, and methods consistent with the disclosure are directed to the fabrication and use of micro scale channels with a gas, where the micro channel can include a base (110) and a side (120), where the base and the side can be configured to form at least a portion of an inflow opening, and an outflow opening. The micro channel can be configured to accommodate a flow of the gas from the inflow opening to the outflow opening in a first direction substantially perpendicular to a cross section of the micro channel. The side can have a thickness in a range 0.5 µm and 500 µm, where the micro channel with a thickness in a range 0.5 µm
(Continued)

and 500 μm is formed, in part, by providing the side on the base.

16 Claims, 5 Drawing Sheets

(51) Int. Cl.
    *F28F 13/08*     (2006.01)
    *H01L 23/467*     (2006.01)
(52) U.S. Cl.
    CPC ... *F28F 2260/02* (2013.01); *H01L 2924/0002* (2013.01)

(56) References Cited

U.S. PATENT DOCUMENTS

| | | | |
|---|---|---|---|
| 2006/0011325 A1 | 1/2006 | Schlitz | |
| 2006/0250776 A1 | 11/2006 | Abul-Haj et al. | |
| 2006/0251552 A1* | 11/2006 | Wang | B01J 19/0093 422/198 |
| 2009/0211977 A1 | 8/2009 | Miller | |
| 2010/0096016 A1 | 4/2010 | Davis | |
| 2010/0122544 A1 | 5/2010 | Yang et al. | |
| 2010/0160463 A1 | 6/2010 | Wang et al. | |

FOREIGN PATENT DOCUMENTS

| | | |
|---|---|---|
| EP | 0 004 333 | 10/1979 |
| EP | 0 376 365 | 7/1990 |
| GB | 2 419 463 | 4/2006 |
| JP | 2008-290027 A | 12/2008 |
| WO | WO 99/09594 | 2/1999 |
| WO | WO 2004/042297 A2 | 5/2004 |
| WO | WO 2005/075606 A1 | 8/2005 |
| WO | WO 2010/039868 | 4/2010 |

OTHER PUBLICATIONS

Excerpt from "The American Heritage Dictionary of Science," R.K. Barnhart (Houghton Mifflin, Boston, 1986) p. 49 (2 pages total).
International Written Opinion for PCT/US2013/061887 (8 pages total).
Apr. 25, 2017 Office Action from Chinese Patent Office for corresponding Chinese Patent Appl. No. 201380062570.7 (15 pages total including English Language Translation).
Apr. 4, 2018 Office Action from Chinese Patent Office for corresponding Chinese Patent Appl. No. 201380062570.7 (4 pages total including English Language Translation).
Nov. 18, 2016 Office Action from Australian Patent Office for corresponding Australian Patent Appl. No. 2013327726 (3 pages total).
Jun. 28, 2018 Office Action from Australian Patent Office for corresponding Australian Patent Appl. No. 2017261474 (3 pages total).
May 30, 2017 Office Action from Japanese Patent Office for corresponding Japanese Patent Appl. No. 2015-535700 (5 pages total including English Language Summary, where English Language Summary includes corrected identifier numbers for references used in Office Action).
Sep. 14, 2016 Search Report from Intellectual Property Office of Singapore for corresponding Singapore Patent Appl. No. 11201502447V (4 pages total).
Sep. 16, 2016 Written Opinion from Intellectual Property Office of Singapore for corresponding Singapore Patent Appl. No. 11201502447V (7 pages total).
Nov. 13, 2017 Written Opinion from Intellectual Property Office of Singapore for corresponding Singapore Patent Appl. No. 11201502447V (8 pages total).
Translation of Sep. 7, 2017 Office Action from the Federal Institute of Industrial Property for corresponding Russian Federation Patent Appl. No. 2015116141 (5 pages total).
Translation of May 2017 Office Action and Search Report from the Taiwan IPO for corresponding Taiwan Patent Appl. No. 102135354 (11 pages total).
Brazil Office Action dated Nov. 21, 2018, in counterpart Brazil Patent Application No. BR 11 2015 007173-2.
Israel Office Action dated Jan. 12, 2019, in counterpart Israel Patent Application No. 237958.
Japan Office Action dated Oct. 30, 2018, in counterpart Japanese Patent Application No. 2015-535700.
Russian Office Action dated Oct. 30, 2018, in counterpart Russian Patent Application No. 2015116141/28.
Singapore Office Action dated Nov. 4, 2018, in counterpart Singapore Patent Application No. 11201502447V.
European Office Action dated Sep. 26, 2018, in counterpart European Patent Application No. 13773560.1.
Japanese Office Action dated Mar. 8, 2019, in counterpart Japanese Patent Application No. 2015-535700.

* cited by examiner

FIG. 5

DEVICE AND METHOD FOR TEMPERATURE CONTROL

This application claims priority to U.S. Provisional Patent Application No. 61/708,619, filed Oct. 1, 2012, the entire contents of which are incorporated herein by reference. This application is related to co-pending U.S. application Ser. No. 12/585,981, filed Sep. 30, 2009, the contents of which are incorporated by reference, and which itself claims the benefit of U.S. Provisional Application No. 61/101,227, filed Sep. 30, 2008. This application is also related to co-pending PCT Application No. PCT/US11/37369, filed May 20, 2011, the contents of which are incorporated by reference, and which itself claims the benefit of U.S. Provisional Application No. 61/347,446, tiled May 23, 2010.

TECHNICAL FIELD

Materials, components, and methods consistent with the present disclosure are directed to the fabrication and use of micro-scale channels with a gas, where the micro-scale channels are configured to control the temperature of the gas.

BACKGROUND

A volume of fluid, such as air, can be characterized by a temperature and pressure. When considered as a collection of constituent particles, comprising, for example, molecules of oxygen and nitrogen, the volume of fluid at a given temperature can be understood as a distribution of constituent particle speeds. This distribution can be characterized, generally, by an average speed which can bear a relationship with the temperature of the gas.

The internal atomic and molecular structure of constituent particles, which can provide a range of accessible internal energy states, can also affect the temperature distribution of the gas. The range of accessible internal energy states associated with an atom or molecule, in turn, can be affected by the geometry and properties of its surroundings.

SUMMARY

In an aspect, a system for cooling can be configured to accommodate a flow of a gas through a micro channel. The system can include a micro channel, and the micro channel can include at least a base and a side, where the base and the side can be configured to form at least a portion of an inflow opening, and an outflow opening. The gas can include a constituent particle, where the gas can be induced to flow through the micro channel through operation of a pressure differential between a first pressure and a second pressure, the first pressure of the gas proximal to the inflow opening being atmospheric and the second pressure of the gas proximal to the outflow opening being less than atmospheric. Moreover, the micro channel can be configured to accommodate a flow of the gas from the inflow opening to the outflow opening in a first direction substantially perpendicular to across section of the micro channel. Further still, the base can be selected from a set of base materials consisting of: aluminum sheet metal, anodized aluminum, Teflon-coated aluminum, painted aluminum, graphene, pyrolytic graphite, and copper sheet metal, and the side can be selected from a set of side materials consisting of: graphene, pyrolytic graphite, aluminum foil, and copper foil. In addition, the side can have a thickness in a range between approximately 0.5 µm and approximately 500 µm, where the micro channel with a thickness in orange between approximately 0.5 µm and approximately 500 µm is formed, in part, by providing the side on the base.

In another aspect, a method for cooling can include providing a micro channel including at least a base and a side, where the base and the side can be configured to form at least a portion of an inflow opening, and an outflow opening. The method for cooling can also include providing a gas comprising a constituent particle, and inducing a flow of the gas from the inflow opening to the outflow opening in a first direction substantially perpendicular to a cross section of the micro channel through operation of a pressure differential between a first pressure and a second pressure, the first pressure of the gas proximal to the inflow opening being atmospheric and the second pressure of the gas proximal to the outflow opening being less than atmospheric. Furthermore, the base can be selected from a set of base materials consisting of: aluminum sheet metal, anodized aluminum, Teflon-coated aluminum, painted aluminum, graphene, pyrolytic graphite, and copper sheet metal, and the side can be selected from a set of side materials consisting of: graphene, pyrolytic, graphite, aluminum foil, and copper foil. In addition, the side can have a thickness in a range between approximately 0.5 µm and approximately 500 µm, where the micro channel with a thickness in a range between approximately 0.5 µm and approximately 500 µm is formed, in part, by providing the side on the base.

In a further aspect, a system for cooling can be configured to accommodate a flow of a gas through a micro channel. The system can include a micro channel, and the micro channel can include at least a base with a raised side, where the base and the raised side can be configured to form at least a portion of an inflow opening, and an outflow opening. The gas can include a constituent particle, where the gas can be induced to flow through the micro channel through operation of a pressure differential between a first pressure and a second pressure, the first pressure of the gas proximal to the inflow opening being atmospheric and the second pressure of the gas proximal to the outflow opening being less than atmospheric. Moreover, the micro channel can be configured to accommodate a flow of the gas from the inflow opening to the outflow opening in a first direction substantially perpendicular to a cross section of the micro channel. Further still, the base can be selected from a set of base materials consisting of: aluminum sheet metal, anodized aluminum, Teflon-coated aluminum, painted aluminum, graphene, pyrolytic graphite, and copper sheet metal. In addition, the raised side can have a thickness in a range between approximately 0.5 µm and approximately 500 µm, where the micro channel with a thickness in a range between approximately 0.5 µm and approximately 500 µm is formed from the base, in part, by at least one of the set of extrusion, embossing, coining, stamping, punching, perforating, and cutting with fine blanking.

In another aspect, a method for cooling can include providing a micro channel including at least a base and a raised side, where the base and the raised side can be configured to form at least a portion of an inflow opening, and an outflow opening. The method for cooling can also include providing a gas comprising a constituent particle, and inducing a flow of the gas from the inflow opening to the outflow opening in a first direction substantially perpendicular to across section of the micro channel through operation of a pressure differential between a first pressure and a second pressure, the first pressure of the gas proximal to the inflow opening being atmospheric and the second pressure of the gas proximal to the outflow opening being less than atmospheric. Furthermore, the base can be selected from a set of base materials consisting of: aluminum sheet metal, anodized aluminum, Teflon-coated aluminum, painted aluminum, graphene, pyrolytic graphite, and copper sheet metal. In addition, the raised side can have a thickness in a range between approximately 0.5 µm and approximately 500 µm, where the micro channel with a thickness in a range between approximately 0.5 µm and approximately 500 µm is formed from the base, in part, by at least one of the set of: extrusion, embossing, coining, stamping, punching, perforating, and cutting with fine blanking.

Additional objects and advantages of the disclosure will be set forth in part in the description which follows, and in part will be obvious from the description, or may be learned by practice of embodiments consistent with the disclosure. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE EMBODIMENTS

Reference will now be made in detail to the present embodiments (exemplary embodiments) of the disclosure, characteristics of which are illustrated in the accompanying drawings. Wherever possible, the same reference numbers will be used throughout the drawings to refer to the same or like parts.

Figure 1:
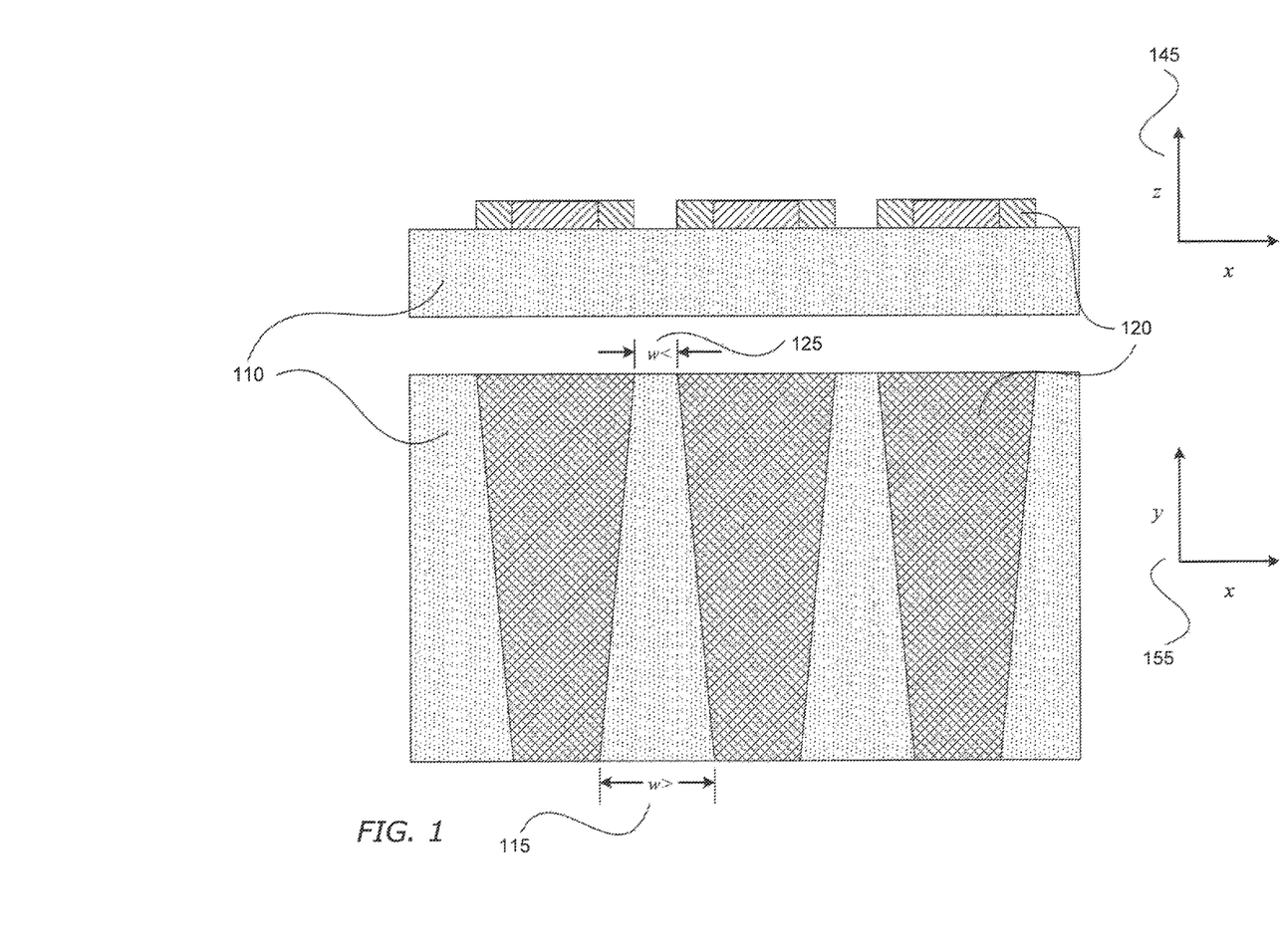
FIG. 1 depicts two views of a base and an arrangement of sides for forming a set of exemplary micro channels consistent with the disclosure.

FIG. 1 depicts two views of a base 110 and an arrangement of sides 120 for forming a set of exemplary micro channels consistent with the disclosure. The lower portion of FIG. 1 depicts a "top" view of the arrangement of the sides 120 on the base 110, and the upper portion of FIG. 1 depicts an "edge" view of the arrangement of the sides 120 on the base 110. For reference, an axis 145 assigns an "x"-direction and a "z"-direction to the figure in the upper portion, and an axis 155 assigns an "x"-direction and a "y"-direction to the figure in the lower portion. The material of the base 110 can include aluminum sheet metal, anodized aluminum, Teflon-coated aluminum, painted aluminum, graphene, pyrolytic graphite, copper sheet metal, and/or any other thermally conductive material that is relatively smooth and flat. The material of the sides 120 can include aluminum foil, copper foil, other metal foils, graphene, pyrolytic graphite, and any other thermally conductive material that is relatively smooth and flat. In the depicted "z"-direction of FIG. 1, the side 120 can have a thickness in a range from approximately 0.5 µm thick to approximately 500 µm.

As illustrated in FIG. 1, the shape of the sides 120 can be selected to form a micro channel that is gradually increasing in cross section as a gas moves (for example) in the negative "y" direction. However, the depicted shape is not limiting. The overall cross section of the micro channel can be configured to exhibit macroscopic length scales in the "x" direction (i.e., meters) and smaller length scales in the "z" direction (i.e., 0.5 to 500 µm), From the perspective of the upper-portion figure shown in FIG. 1, the cross section of the micro channel shown "nearest" the edge that is viewed is depicted as larger than the cross section of the micro channel that is furthest away from the edge that is viewed. The thickness of the "z"-dimension of the sides 120 can be approximately 15 µm, but can be anywhere in a range from approximately 0.5 µm to approximately 500 µm. An inflow width 125 (i.e., the variable "w<" in FIG. 1) in the "x"-direction between the arranged sides 120 in FIG. 1 can be 10 mm, but can be anywhere in a range from approximately 1 µm to several centimeters. An outflow width 115 (i.e., the variable "w>" in FIG. 1) in the "x"-direction between the arranged sides 120 in FIG. 1 can be 20 mm, but can be anywhere in a range from approximately 1 µm to several centimeters. The length of base 110 and side 120 in the "y" direction can be anywhere in a range from 1 mm to lengths in the scale of meters. At lengths of approximately hundreds of millimeters and more in the "y" direction, however, micro channel support can be required to maintain a 0.5 µm to 500 µm micro channel opening thickness (whether as an inflow opening or as an outflow opening). Further, the dimensions of the micro channel in the "z" direction from the inflow to the outflow need not remain at a constant height and can vary both along the "y" axis direction and the "x" axis direction between approximately 0.5 µm and approximately 500 µm consistent with the current disclosure. (Note that FIG. 1, and all of the figures, FIGS. 2-5, are not necessarily depicted to scale.)

Figure 2:
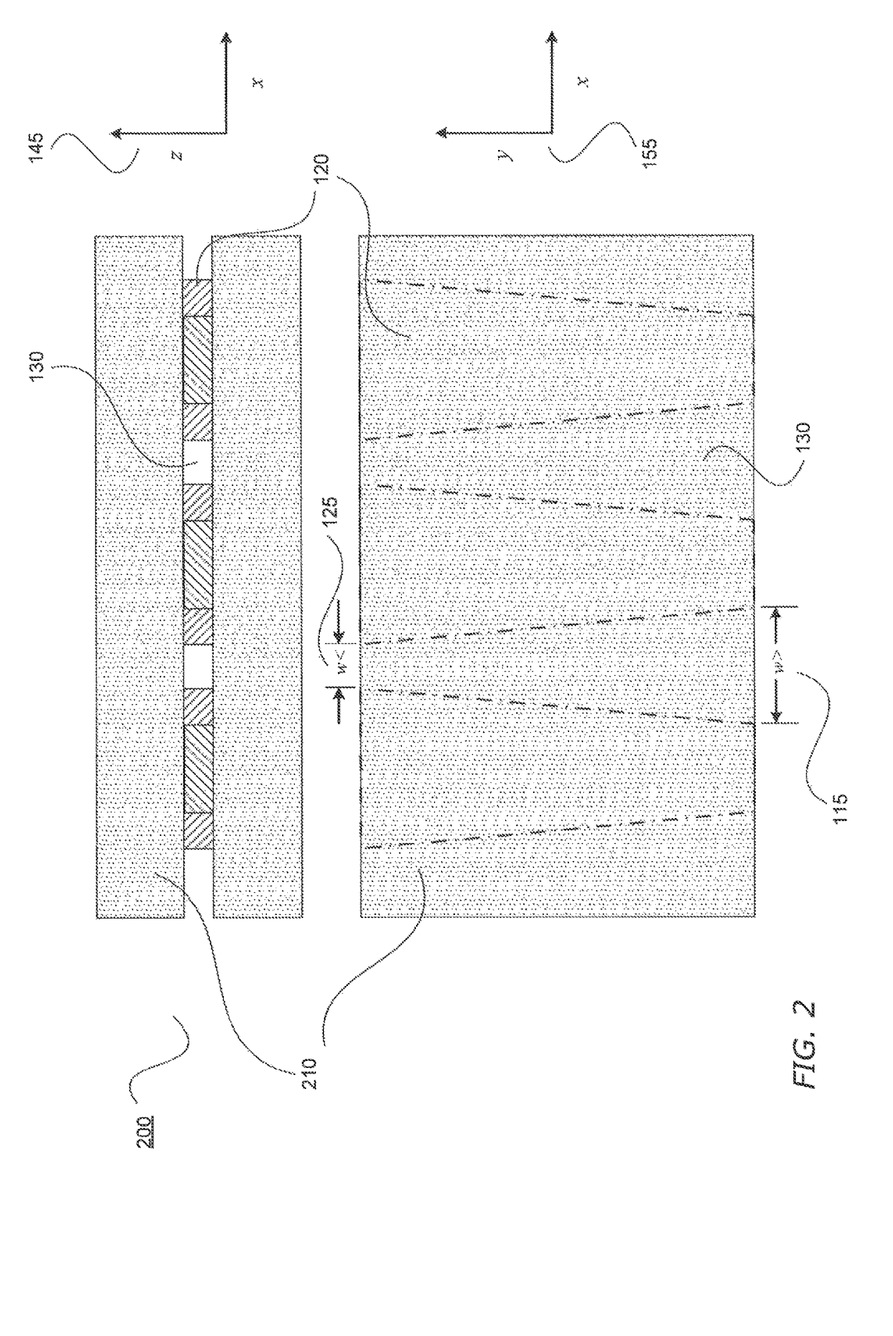
FIG. 2 depicts two views of the base and the sides of FIG. 1, with an additional base arranged to form a set of exemplary micro channels consistent with the disclosure.

As illustrated in FIG. 2, an additional base 210 can be positioned over the arrangement depicted in FIG. 1 in order to form a set of micro channels 130 with an inflow width 125 (the variable "w<") and an outflow width 115 (the variable "w>"). Due to the dimensions of the sides 120 in the "z"-direction, the set of micro channels 130 have a dimension in the "z" direction of approximately 15 µm, but can be anywhere in the range from approximately 0.5 µm to approximately 500 µm. The micro channels that are formed can maintain the same, approximate, "z" axis dimension along the length of the "x" axis direction, or the "z" axis dimension can vary from between approximately 0.5 µm to approximately 500 µm along both the "x" axis direction and the "y" axis direction consistent with the disclosure. The overall width of the entire device 200 in the "X" axis direction can be 40 mm to 100 mm or it can be approximately less than 1 mm to many meters—and could even extend to kilometers, if required, based on the application. That is, one of ordinary skill in the art should appreciate that the scale of the device in the "x" axis can vary by application. A representative device width that is intended to fit inside of a semiconductor package can be determined by the "x" axis of the semiconductor package (such as millimeters). However, computer server racks can use devices that are scaled to the rack. Larger applications like commercial air conditioning devices can be of the scale of tens of meters along the "x" axis.

The base 210 can be secured to the base 110 to form device 200 using epoxy, and/or other chemical adhesives. One of ordinary skill in the art should appreciate that the application of the epoxy and/or chemical adhesive can be accomplished so as avoid adversely affecting the size of the micro channels 130 in the "z" direction. For example, the epoxy and/or chemical adhesive can be applied in a thin film. Welding, brazing, and metal bonding can also be used to secure the base 210 to the base 110 when the surfaces of base 210 and base 110 are adequately smooth and flat, and adequate pressure is applied to the parts provide a thermal path without the added thermal resistance of air gaps. Further, fasteners such as pins, rivets screws and bolts can also be used.

Figure 3:
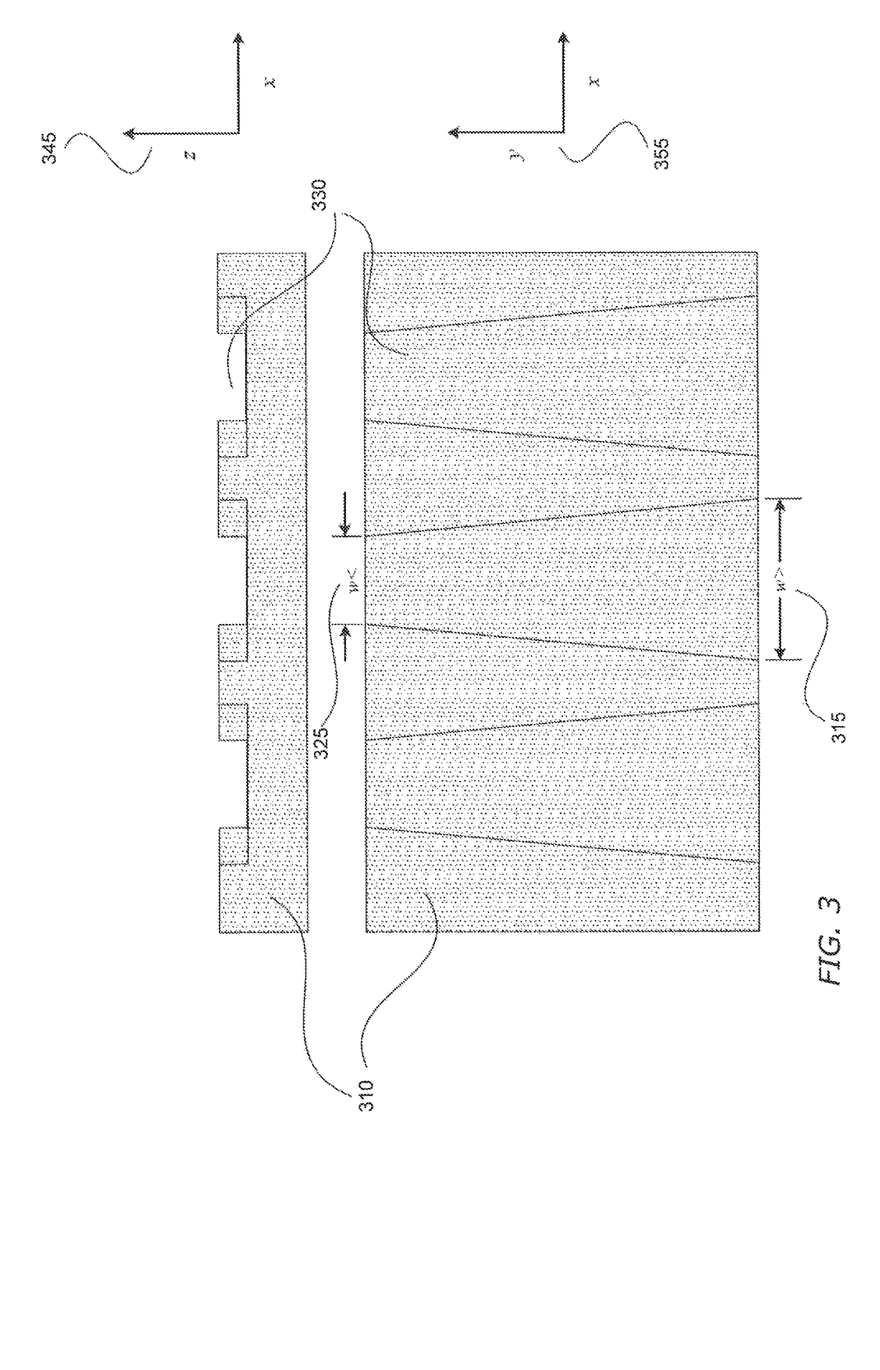
FIG. 3 depicts two views of a base with raised sides for forming a set of exemplary micro channels consistent with the disclosure.

Consistent with a further embodiment, FIG. 3 depicts two views of a base 310 and an arrangement of raised sides for forming a set of exemplary micro channels 330 consistent with the disclosure. The lower portion of FIG. 3 depicts a "top" view of the arrangement of the raised sides on the base 310, and the upper portion of FIG. 3 depicts an "edge" view of the arrangement of the raised sides on the base 310. For reference, an axis 345 assigns an "x"-direction and a "z"-direction to the figure in the upper portion, and an axis 355 assigns an "x"-direction and a "y"-direction to the figure in the lower portion. The material of the base 310 can include aluminum sheet metal, anodized aluminum, Teflon-coated aluminum, painted aluminum, graphene, pyrolytic graphite, copper sheet metal, or any other thermally conductive material that is relatively smooth and flat. The material of the base 310 can also include extrusions of tubing made of thermally conductive metals, graphene, pyrolytic graphite, carbon nanotubes, polymers or other thermally conductive materials. Where the material of the base 310 includes tubing, the tubing can have inside diameters in the range of approximately 0.5 µm to approximately 500 µm. Generally speaking (that is, whether tubing or otherwise), the material of the raised sides can be the same material as the base 310, with the micro channels 330 formed by extrusion, embossing, coining, stamping, punching, and/or perforating, and/or can be cut with fine blanking to maintain integrity of micro channel features.

As illustrated in FIG. 3, the shape of the micro channels 330 can be selected so as to be gradually increasing in cross section as a gas moves (for example) in the negative "y" direction. However, the depicted shape is not limiting. The overall cross section of the micro channel can be configured to be of macroscopic scale, for example, exhibiting a width in the "x" axis direction that is greater than 1 mm, with "z" axis heights of approximately 0.5 µm to approximately 500 µm (with overall "x" axis lengths of the device of the scale of meters). From the perspective of the upper-portion figure shown in FIG. 3, the cross section of the micro channel shown "nearest" the edge that is viewed is depicted as larger than the cross section of the micro channel that is furthest away from the edge that is viewed. The thickness of the "z"-dimension of the micro channels 330 can be approximately 15 µm, but can be anywhere in a range from approximately 0.5 pm to approximately 500 µm. An inflow width 325 (i.e., the variable "w<" in FIG. 3) in the "x"-direction between the raised sides in FIG. 3 can be 10 mm, but can be anywhere in a range from approximately 1 mm to several hundred millimeters. An individual micro channel can have a "y" axis length of hundreds of millimeters before micro channel support might be required to maintain a 0.5 µm to 500 µm micro channel opening thickness. Further still, the micro channel opening need not remain at a constant "z" axis height and may vary both along the x axis and they axis from 0.5 µm to 500 µm consistent with the current disclosure. As described above, the "x" axis length can be scaled for the application. Examples of devices that can exhibit millimeter-scale "x" axis lengths include devices configured to fit inside, semiconductor packages, and examples of devices that can exhibit meter-scale lengths includes devices configured for commercial scale air conditioning system heat exchangers. An outflow width 315 (i.e., the variable "w>" in FIG. 3) in the "x"-direction between the raised sides in FIG. 3 can be 20 mm, but can be anywhere in a range from approximately 1 mm to hundreds of mm.

Figure 4:
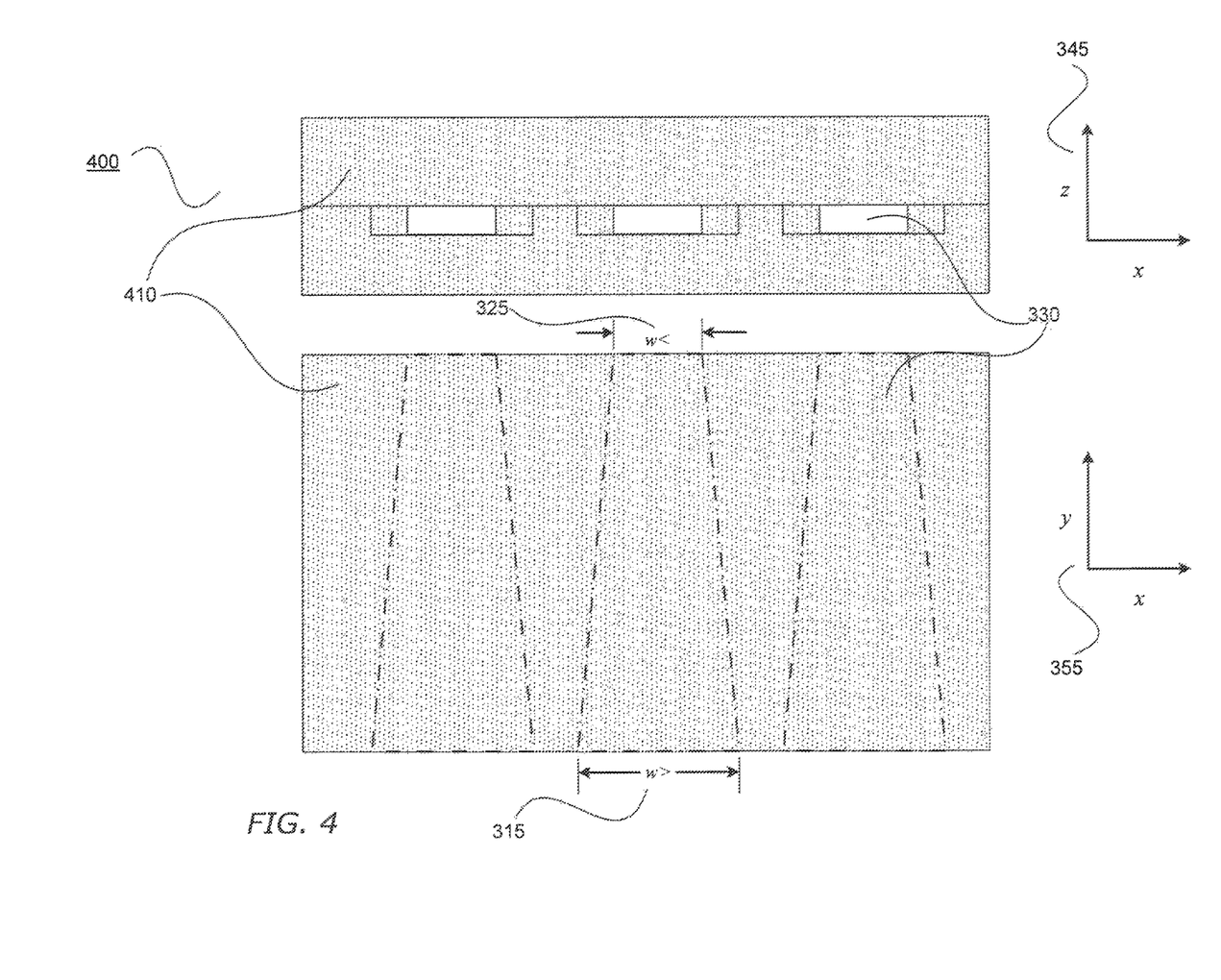
FIG. 4 depicts two views of the base and the arranged sides of FIG. 3, with an additional base arranged to form a set of exemplary micro channels consistent with the disclosure.

As illustrated in FIG. 4, an additional base 410 can be positioned over the arrangement depicted in FIG. 3 in order to form a set of micro channels 330 with an inflow width 325 (the variable "w<") and an outflow width 315 (the variable "w>"). The set of micro channels 330 can have a dimension in the "z" direction of approximately 15 µm, but can be anywhere in the range from approximately 0.5 µm to 500 µm. The overall width of the entire device 400 in the "x" direction can be 40 mm to 100 mm or approximately 1 mm to the scale of meters or more (such as kilometers)—based upon the application. That is, the "x" axis length of the overall device can be scaled according to the application. For example, devices that exhibit lengths of the scale of millimeters can be used with semiconductor packages, and devices that exhibit lengths of the scale of meters can be used with commercial scale air conditioning system heat exchangers.

The base 410 can be secured to the base 310 to form device 400 using epoxy and/or other chemical adhesives. One of ordinary skill in the art should appreciate that the application of the epoxy and/or chemical adhesive can be accomplished so as avoid adversely affecting the size of the micro channels in the "z" direction. For example, the epoxy and/or chemical adhesive can be applied in a thin film. Welding, brazing, and metal bonding can be used to secure the base 410 to the base 310 when the surfaces of base 410 and base 310 are adequately smooth and flat, and adequate pressure is applied to the parts provide a thermal path without the added thermal resistance of air gaps. Further, fasteners such as pins, rivets screws and bolts can be used as well.

Figure 5:
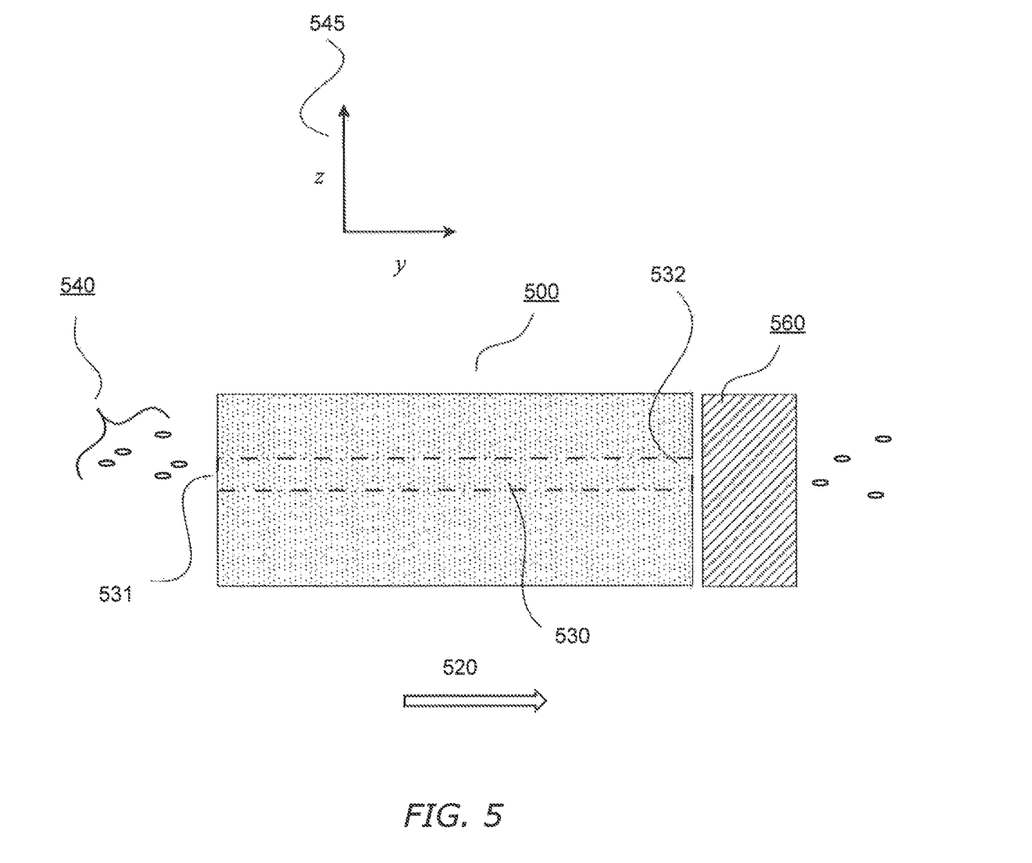
FIG. 5 depicts a side view of a micro channel configured to accommodate a flow of gas consistent with the disclosure, including an apparatus for inducing flow through the micro channel.

FIG. 5 depicts a device 500 with a micro channel 530 (or a set of micro channels) constructed consistent with this disclosure. Also depicted in FIG. 5 is gas 540 and a direction of flow 520 to generate cooling in the device 500. Device 560 is any apparatus which can induce a flow between an inflow opening 531 of the micro channel 530 and an outflow opening 532 of the micro channel 530.

Device 560 can include fans including micro-fans, blowers, pumps including micro-pumps, natural sources such as atmospheric wind and thermal airflows, bellows and any other device used to create a pressure differential.

Other embodiments will be apparent to those skilled in the art from consideration of the specification and practice of the embodiments disclosed herein. For example, consistent with the disclosure, the overall shape of the micro channels and the relative widths of the inflow opening and the outflow opening that are depicted in FIGS. 1-5 are exemplary only and not limiting. Consistent with the disclosure, a micro channel consistent with the current disclosure can exhibit a variety of cross sectional shapes—including variations in cross sectional shape along a length of the micro channel—further exhibiting a variety of relative ratios of: inflow opening to outflow opening, Co-pending U.S. application Ser. No. 12/585,981, filed Sep. 30, 2009, the contents of which are incorporated by reference, discloses exemplary variations in cross sectional shapes, inflow openings, and outflow openings consistent with the current disclosure. Further still, a micro channel (or set of micro channels) consistent with the current disclosure can exhibit macroscopic features, such as the exemplary macroscopic geometries disclosed in co-pending PCT Application No. PCT/U811/37369, filed May 20, 2011, the contents of which are incorporated by reference. Further still, a system consistent with the current disclosure can configured so as to exhibit a plurality of device layers, with each device layer corresponding, for example, to a device with one or a plurality of micro channels as depicted in FIGS. 1-5. More specifically, a system with plurality of device layers can correspond, generally, to a plurality of devices 200 and/or devices 400 stacked one on another. It is intended that the specification and examples be considered as exemplary only, with a true scope and spirit of the invention being indicated by the following claims.

What is claimed is:

1. A system for cooling comprising:
   a micro channel layer; and
   a gas, wherein the gas is air;
   wherein the micro channel layer comprises:
      a micro channel and an aligned micro channel, the micro channel layer comprising at least a first base, a second base, a first side, a second side, and a third side;
   wherein the first base, the second base, the first side, and the second side are configured to form an inflow opening;
   wherein the first base, the second base, the second side, and the third side are configured to form an aligned inflow opening and an aligned outflow opening;
   wherein the inflow opening and the aligned inflow opening form a set of inflow openings;
   wherein the outflow opening and the aligned outflow opening form a set of outflow openings;
   wherein the gas is induced to flow through the micro channel and the aligned micro channel through operation of a pressure differential between a first pressure and a second pressure, the first pressure of the gas proximal to the set of inflow openings being atmospheric and the second pressure of the gas proximal to the set of outflow openings being less than atmospheric;
   wherein the micro channel layer is configured to accommodate a flow of the gas from the set of inflow openings to the set of outflow openings in a first direction substantially perpendicular to a cross section of the micro channel layer;
   wherein the first base and the second base are selected from a set of base materials consisting of: aluminum sheet metal, anodized aluminum, Teflon-coated aluminum, painted aluminum, copper sheet metal, graphene, and pyrolytic graphite;
   wherein the first side, the second side, and the third side are selected from a set of side materials consisting of: aluminum foil, copper foil, graphene, and pyrolytic graphite;
   wherein the first side has a thickness of approximately 15 μm;
   wherein the second side has a thickness of approximately 15 μm; and
   wherein the third side has a thickness of approximately 15 μm, and wherein the micro channel layer is formed, in part, by providing the first side, the second side, and the third side on the first base such that a channel is formed between the first side and the second side and such that an aligned channel is formed between the second side and the third side, and by providing the second base on the first side, the second side, and the third side.

2. The system of claim 1 wherein the inflow opening has an inflow width value in a width range between approximately 1 μm and approximately 30 mm; and
   wherein the outflow opening has an outflow width value in the width range between approximately 1 μm and approximately 30 mm.

3. The system of claim 2 wherein a linear distance between the inflow opening and the outflow opening along a length of the micro channel layer has a value in a range of approximately 0.01 mm to approximately 10 m.

4. The system of claim 2, wherein the inflow width value is smaller than the outflow width value.

5. A method for cooling, comprising:
   providing a micro channel layer;
   wherein the micro channel layer comprises a micro channel and an aligned micro channel, the micro channel layer comprising at least a first base, a second base, a first side, a second side, and a third side;
   wherein the first base, the second base, the first side, and the second side are configured to form an inflow opening and an outflow opening;
   wherein the first base, the second base, the second side, and the third side are configured to form an aligned inflow opening and an aligned outflow opening;
   wherein the inflow opening and the aligned inflow opening form a set of inflow openings;
   wherein the outflow opening and the aligned outflow opening form a set of outflow openings;
   providing a gas, wherein the gas is air;
   inducing a flow of the gas from the set of inflow openings to the set of outflow openings in a first direction substantially perpendicular to a cross section of the micro channel layer through operation of a pressure differential between a first pressure and a second pressure, the first pressure of the gas proximal to the set of inflow openings being atmospheric and the second pressure of the gas proximal to the set of outflow openings being less than atmospheric;
   wherein the first base and the second base are selected from a set of base materials consisting of: aluminum sheet metal, anodized aluminum, Teflon-coated aluminum, painted aluminum, copper sheet metal, graphene, and pyrolytic graphite;
   wherein the first side, the second side, and the third side are selected from a set of side materials consisting of: aluminum foil, copper foil, graphene, and pyrolytic graphite;
   wherein the first side has a thickness of approximately 15 μm;
   wherein the second side has a thickness of approximately 15 μm; and
   wherein the third side has a thickness of approximately 15 μm, and wherein the micro channel layer is formed, in part, by providing the first side, the second side, and the third side on the first base such that a channel is formed between the first side and the second side and such that an aligned channel is formed between the second side and the third side, and by providing the second base on the first side, the second side, and the third side.

6. The method of claim 5 wherein the inflow opening has an inflow width value in a width range between approximately 1 μm and approximately 30 mm; and wherein the outflow opening has an outflow width value in the width range between approximately 1 μm and approximately 30 mm.

7. The method of claim 6 wherein a linear distance between the inflow opening and the outflow opening along a length of the micro channel layer has a value in a second range of approximately 0.01 mm to approximately 10 m.

8. The method of claim 6 wherein the inflow width value is smaller than the outflow width value.

9. A system for cooling comprising:
a micro channel layer; and
a gas, wherein the gas is air;
wherein the micro channel layer comprises:
   a micro channel and an aligned micro channel, the micro channel layer comprising at least a first base with a first raised side, a second raised side, and a third raised side, and a second base;
wherein the first base with the first raised side, the second raised side, and the third raised side, and the second base are configured to form an inflow opening, an aligned inflow opening, an outflow opening, and an aligned outflow opening;
wherein the inflow opening and the aligned inflow opening from a set of inflow openings;
wherein the outflow opening and the aligned outflow opening form a set of outflow openings;
wherein the gas is induced to flow through the micro channel and the aligned micro channel through operation of a pressure differential between a first pressure and a second pressure, the first pressure of the gas proximal to the set of inflow openings being atmospheric and the second pressure of the gas proximal to the set of outflow openings being less than atmospheric;
wherein the micro channel layer is configured to accommodate a flow of the gas from the set of inflow openings to the set of outflow openings in a first direction substantially perpendicular to a cross section of the micro channel layer;
wherein the first base and the second base are selected from a set of base materials consisting of: aluminum sheet metal, anodized aluminum, Teflon-coated aluminum, painted aluminum, copper sheet metal, graphene, and pyrolytic graphite; and
wherein the first raised side has a height of approximately 15 μm;
wherein the second raised side has a height of approximately 15 μm; and
wherein the third raised side has a height of approximately 15 μm, and wherein the micro channel layer is formed from the first base, in part, by at least one of the set of: extrusion, embossing, coining, stamping, punching, perforating, and cutting with fine blanking, the first raised side, the second raised side, and the third raised side from the first base such that a channel is formed between the first raised side and the second raised side and such that an aligned channel is formed between the second raised side and the third raised side.

10. The system of claim 9 wherein the inflow opening has an inflow width value in a width range between approximately 1 μm and approximately 30 mm; and
wherein the outflow opening has an outflow width value in the width range between approximately 1 μm and approximately 30 mm.

11. The system of claim 10 wherein a linear distance between the inflow opening and the outflow opening along a length of the micro channel layer has a value in a second range of approximately 0.01 mm to approximately 10 m.

12. The system of claim 10, wherein the inflow width value is smaller than the outflow width value.

13. A method for cooling, comprising:
providing a micro channel layer;
wherein the micro channel layer comprises a micro channel and an aligned micro channel, the micro channel layer comprising at least a first base with a first raised side, a second raised side, and a third raised side, and a second base;
wherein the first base with the first raised side, the second raised side, and the third raised side, and the second base are configured to form an inflow opening, an aligned inflow opening, an outflow opening, and an aligned outflow opening;
wherein the inflow opening and the aligned inflow opening form a set of inflow openings;
wherein the outflow opening and the aligned outflow opening form a set of outflow openings;
providing a gas, wherein the gas is air;
inducing a flow of the gas from the set of inflow openings to the set of outflow openings in a first direction substantially perpendicular to a cross section of the micro channel layer through operation of a pressure differential between a first pressure and a second pressure, the first pressure of the gas proximal to the set of inflow openings being atmospheric and the second pressure of the gas proximal to the set of outflow openings being less than atmospheric;
wherein the first base and the second base are selected from a set of base materials consisting of: aluminum sheet metal, anodized aluminum, Teflon-coated aluminum, painted aluminum, copper sheet metal, graphene, and pyrolytic graphite; and
wherein the first raised side has a height of approximately 15 μm;
wherein the second raised side has a height of approximately 15 μm; and
wherein the third raised side has a height of approximately 15 μm, and wherein the micro channel layer is formed from the first base, in part, by at least one of the set of: extrusion, embossing, coining, stamping, punching, perforating, and cutting with fine blanking, the first raised side, the second raised side, and the third raised side from the first base such that a channel is formed between the first raised side and the second raised side and such that an aligned channel is formed between the second raised side and the third raised side.

14. The method of claim 13 wherein the inflow opening has an inflow width value in a width range between approximately 1 μm and approximately 30 mm; and
wherein the outflow opening has an outflow width value in the width range between approximately 1 μm and approximately 30 mm.

15. The method of claim 14 wherein a linear distance between the inflow opening and the outflow opening along a length of the micro channel layer has a value in a second range of approximately 0.01 mm to approximately 10 m.

16. The method of claim 14 wherein the inflow width value is smaller than the outflow width value.

* * * * *